United States Patent
Suyama et al.

(10) Patent No.: US 9,972,776 B2
(45) Date of Patent: May 15, 2018

(54) PLASMA PROCESSING METHOD

(71) Applicant: Hitachi High-Technologies Corporation, Tokyo (JP)

(72) Inventors: Makoto Suyama, Tokyo (JP); Naohiro Yamamoto, Tokyo (JP); Masato Ishimaru, Tokyo (JP); Hidenori Toyooka, Tokyo (JP); Norihiro Hosaka, Tokyo (JP)

(73) Assignee: Hitachi High-Technologies Corporations, Tokyo (JP)

( * ) Notice: Subject to any disclaimer, the term of this patent is extended or adjusted under 35 U.S.C. 154(b) by 0 days. days.

(21) Appl. No.: 15/260,351

(22) Filed: Sep. 9, 2016

(65) Prior Publication Data

US 2017/0194561 A1    Jul. 6, 2017

(30) Foreign Application Priority Data

Jan. 4, 2016   (JP) ................ 2016-000033

(51) Int. Cl.
*H01J 37/32*   (2006.01)
*H01L 43/12*   (2006.01)
(Continued)

(52) U.S. Cl.
CPC ........... *H01L 43/12* (2013.01); *B08B 9/08* (2013.01); *H01J 37/321* (2013.01);
(Continued)

(58) Field of Classification Search
CPC ............................................. H01J 37/32862
See application file for complete search history.

(56) References Cited

U.S. PATENT DOCUMENTS

2006/0191555 A1* 8/2006 Yoshida ............... B08B 7/0035
                                                            134/1.1
2006/0245116 A1* 11/2006 Klostermann .......... G11C 11/15
                                                            360/324.2
(Continued)

FOREIGN PATENT DOCUMENTS

JP    2000-012515 A    1/2000
JP    2002-359234 A    12/2002
(Continued)

OTHER PUBLICATIONS

JPO Machine Translation of JP2000-012515 to Makoto.*
Korean Office Action received in corresponding Korean Application No. 10-2016-0098396 dated Oct. 30, 2017.

*Primary Examiner* — Peniel M Gumedzoe
*Assistant Examiner* — Christopher Johnson
(74) *Attorney, Agent, or Firm* — Mattingly & Malur, PC

(57) ABSTRACT

According to one embodiment of the present invention, there is provided a plasma processing method for forming a pattern of a mask on a laminated film of a magnetic film and a metal oxide film, and the plasma processing method includes: plasma etching the magnetic film in a chamber; and after the plasma etching, plasma cleaning the chamber, wherein the plasma cleaning performs first plasma cleaning of plasma cleaning using a gas mixture of chlorine element-containing gas and boron trichloride gas, and after the first plasma cleaning, second plasma cleaning of removing boron remaining in the chamber.

19 Claims, 6 Drawing Sheets

(51) Int. Cl.
*B08B 9/08* (2006.01)
*H01L 43/08* (2006.01)
*H01L 43/10* (2006.01)
*B08B 7/00* (2006.01)

(52) U.S. Cl.
CPC ..... *H01J 37/3211* (2013.01); *H01J 37/32165* (2013.01); *H01J 37/32651* (2013.01); *H01J 37/32853* (2013.01); *H01J 37/32862* (2013.01); *H01L 43/08* (2013.01); *H01L 43/10* (2013.01); *B08B 7/0035* (2013.01); *H01J 2237/334* (2013.01); *H01J 2237/335* (2013.01)

(56) References Cited

U.S. PATENT DOCUMENTS

2013/0146563 A1* 6/2013 Abe .................. H01J 37/321
 216/22
2013/0244344 A1* 9/2013 Malmhall ............ B82Y 10/00
 438/3

FOREIGN PATENT DOCUMENTS

| JP | 2006-237432 A | 9/2006 |
| JP | 2013-120810 A | 6/2013 |
| KR | 10-1266053 B1 | 5/2013 |

* cited by examiner

PLASMA PROCESSING METHOD

BACKGROUND OF THE INVENTION

The present disclosure relates generally to a plasma processing method using a plasma processing apparatus, and more particularly, to a plasma processing method including a step of plasma etching a processed substrate having a laminated structure including a magnetic film and a metal oxide film.

Dynamic random access memories (hereinafter referred to as DRAMs) and flash memories have conventionally been widely used in electronic devices and the like. These two types of memories, which differ in volatility (i.e., one is volatile, and the other is non-volatile), each suffer from its own disadvantages. A DRAM is a volatile memory, and is primarily used as a memory of a personal computer (hereinafter referred to simply as PC). Once the PC is shut off, data stored in the DRAM are lost.

In contrast, a flash memory is a non-volatile memory, and therefore shutting off a PC does not cause data stored in a flash memory to be lost semi-permanently. However, a data write operation on such a memory is very slow. Thus, use of a magnetoresistive random access memory (hereinafter referred to as MRAM), which is a non-volatile memory capable of overcoming these disadvantages, and at the same time, of achieving a high speed read operation, high capacity, low cost, and low power consumption, is desirable.

An MRAM utilizes a difference in electrical resistance associated with magnetization orientation directions of magnetic layers thereof. An MRAM requires a technique for processing at a fine scale by dry etching a magnetic film containing Fe, Co, Ni, and/or other elements, formed on a substrate using a masking material formed by lithography.

The technique of dry etching magnetic films can be either ion beam etching or plasma etching. Among these, plasma etching is widely used in the field of semiconductor device fabrication, and is more suitable for mass production due to uniformity of plasma etching of large diameter substrates.

Examples of a magnetic film etching technique using plasma etching include: a technique that utilizes formation of a chloride by $Cl_2$ plasma formed by ionizing $Cl_2$ gas; a technique that utilizes sputtering effect through ionization of Ar gas, which is an inert gas, or the like; and a technique that utilizes formation of a metal carbonyl by CO-containing plasma, formed by ionizing a mixture gas of CO gas and $NH_3$ gas, or CO-containing gas such as $CH_3OH$.

Among plasma cleaning methods, JP-A-2000-012515 discloses a cleaning method including steps of etching a laminated film formed of aluminum (Al) and titanium nitride (TiN), and thereafter using, as a cleaning gas, a gas mixture of boron trichloride ($BCl_3$) gas and chlorine ($Cl_2$) gas, or a gas mixture of boron trichloride ($BCl_3$) gas and hydrogen chloride (HCl) gas, thereby to reduce the amount of deposit formed in the chamber to prevent formation of foreign matters.

JP-A-2002-359234 discloses a method including steps of removing metals, such as iron (Fe) and/or copper (Cu), adhered on an inner surface of a plasma processing chamber by plasma cleaning using fluorinated diketone gas, and thereafter removing an organic material adhered on the inner surface of the plasma processing chamber by oxygen ($O_2$)-based plasma cleaning.

JP-A-2013-120810 discloses a method including steps of removing iron (Fe), nickel (Ni), and/or the like by a plasma cleaning technique using chlorine-containing gas, and thereafter removing the chlorine constituent remaining after the cleaning process from etching chamber by a plasma cleaning technique using hydrogen-containing gas, thereby to improve implantation of the chlorine constituent into a wafer having a magnetic film to reduce or eliminate corrosion on a wafer surface.

SUMMARY OF THE INVENTION

In the plasma cleaning method disclosed in JP-A-2000-012515, the boron constituent remains in the etching chamber after the cleaning process. Thus, a subsequent etching process of a wafer having a magnetic film causes the boron constituent remaining in the etching chamber to act to remove, through a reducing action, the oxygen constituent of magnesium oxide (MgO), which is the etched material. This reduces electrical insulation effect, and thus presents a problem in that device properties will be deteriorated.

The plasma cleaning method disclosed in JP-A-2002-359234 uses fluorinated diketone gas as the cleaning gas to remove metals, such as iron (Fe) and/or copper (Cu), which are the etched materials, by a cleaning process. This fluorinated diketone gas has six or more fluorine atoms per molecule. Thus, use of fluorinated diketone gas having six or more fluorine atoms per molecule for aluminum (Al)-containing base material in the etching chamber, and/or an aluminum (Al)-containing protective film of the inner wall of the etching chamber causes aluminum and fluorine (F) to excessively react with each other. This reaction yields a significant amount of low-volatile aluminum fluoride, which results in formation of foreign matters.

In the plasma cleaning method disclosed in JP-A-2013-120810, the hydrogen constituent remains in the etching chamber after the cleaning process. Thus, a subsequent etching process of a wafer having a magnetic film causes the hydrogen constituent remaining in the etching chamber to act to remove, through a reducing action, the oxygen constituent of magnesium oxide (MgO), which is an etched material. This reduces electrical insulation effect, and thus presents a problem in that device properties will be deteriorated.

Accordingly, the present invention provides a plasma processing method including steps of plasma etching a wafer having a laminated structure including a magnetic film and a metal oxide film; and plasma cleaning capable of maintaining an electrical insulation effect of a metal oxide film layer, and capable of efficiently removing a deposit in the etching chamber in which the magnetic film and the metal oxide film have been plasma etched.

According to one embodiment of the present invention, there is provided a plasma processing method for forming a pattern of a mask on a laminated film of a magnetic film and a metal oxide film, and the plasma processing method includes: plasma etching the magnetic film in a chamber; and after the plasma etching, plasma cleaning the chamber, wherein the plasma cleaning performs first plasma cleaning of plasma cleaning using a gas mixture of chlorine element-containing gas and boron trichloride gas, and after the first plasma cleaning, second plasma cleaning of removing boron remaining in the chamber.

In addition, according to one embodiment of the present invention, there is provided a plasma processing method for forming a pattern of a mask on a laminated film of a magnetic film and a metal oxide film using an inductively-coupled plasma etching apparatus having a Faraday shield, and the method includes: plasma etching the magnetic film in a chamber; and after the plasma etching, plasma cleaning the chamber, wherein the plasma cleaning performs first plasma cleaning of plasma cleaning using a gas mixture of chlorine element-containing gas and boron trichloride gas, and after the first plasma cleaning, second plasma cleaning of removing boron remaining in the chamber, during the first plasma cleaning, a radio frequency voltage is applied to the Faraday shield, during the second plasma cleaning, a radio frequency voltage is applied to the Faraday shield, and the radio frequency voltage applied during the second plasma cleaning is lower than the radio frequency voltage applied during the first plasma cleaning.

According to one embodiment of the present invention, etching a laminated film having a magnetic film and a metal oxide film can maintain an electrical insulation effect of a metal oxide film layer of the laminated film having a magnetic film and a metal oxide film, and can efficiently remove a deposit in the etching chamber in which the magnetic films and the metal oxide film have been plasma etched.

DESCRIPTION OF THE EMBODIMENTS

The present invention is directed to a plasma processing method including steps of plasma etching a wafer having a laminated structure including a magnetic film and an insulation film using a plasma etching apparatus, and, after discharging the wafer whose magnetic film and insulation film have been plasma etched, from an etching chamber, plasma cleaning the inside of the etching chamber. The step of plasma cleaning according to one embodiment of the present invention includes a sub-step of removing a deposit including a magnetic film and an insulation film by means of plasma formed from a gas mixture of chlorine gas and boron trichloride gas, and a sub-step of removing boron remaining in the etching chamber by means of plasma formed from a gas mixture of carbon tetrafluoride gas and oxygen-containing gas.

A preferred embodiment of the present invention will be described below.

Figure 1:
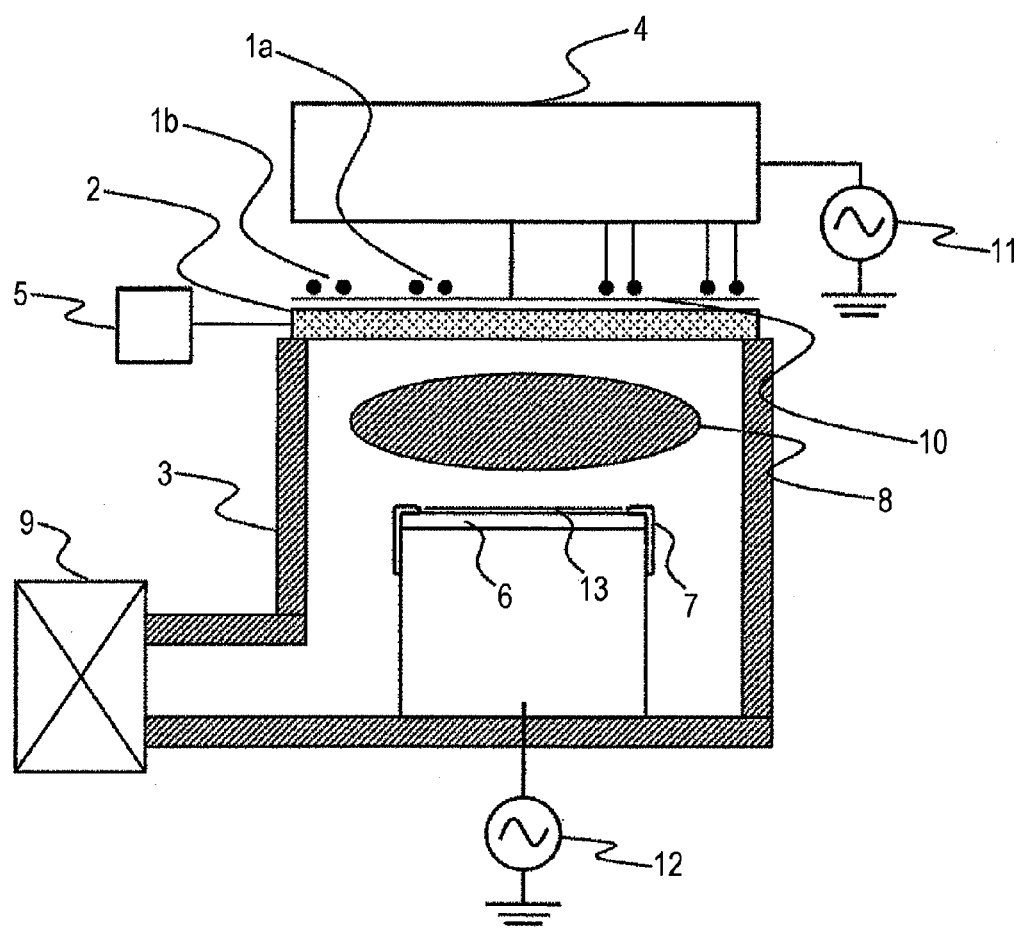
FIG. 1 is a cross-sectional view illustrating a plasma etching apparatus according to one embodiment of the present invention.

First, a plasma etching apparatus in which one embodiment of the present invention is embodied will be described with reference to FIG. 1. The plasma etching apparatus includes an etching chamber. The etching chamber includes an electric discharge unit 2 and a plasma processing chamber 3. The electric discharge unit 2 serves as a plasma generator, and is formed of a non-electrically conductive material, such as quartz ($SiO_2$) or ceramic ($Al_2O_3$). The plasma processing chamber 3 includes therein an electrode 6. The electrode 6 receives a wafer 13 thereon, which is a sample. The electrode 6 is covered with a susceptor 7 formed of a non-electrically conductive material such as ceramic ($Al_2O_3$), except for the wafer mount surface. The electrode 6 is supplied with radio frequency bias power.

The plasma processing chamber 3 is grounded. The electrode 6 is placed in the plasma processing chamber 3, with an electrically insulating material interposed between the electrode 6 and, for example, a portion of the plasma processing chamber 3. There are provided, on the outer side of the electric discharge unit 2, an induction antenna 1 having a first induction antenna element 1a and a second induction antenna element 1b, a Faraday shield 10, and a first radio frequency power supply 11. The Faraday shield 10 is a capacitively-coupled electrode disposed between the induction antenna 1 and the electric discharge unit 2. The first radio frequency power supply 11 supplies, via a matching device 4, radio frequency power for plasma generation to the induction antenna 1.

The present plasma etching apparatus applies a radio frequency voltage from the first radio frequency power supply 11 via the matching device 4 to the Faraday shield 10. This configuration enables reduction or elimination of adhesion of a reaction product to the electric discharge unit 2, and/or removal of a reaction product from the electric discharge unit 2. The etching chamber is supplied with process gas from a gas supply 5, and is evacuated by an exhaust device 9 for pressure reduction to a predetermined pressure.

The gas supply 5 supplies the process gas into the etching chamber, in which plasma 8 is generated from the process gas by an action of an induced magnetic field generated by the induction antenna 1. In order to cause ions in the plasma 8 to migrate to the wafer 13, a radio frequency bias voltage is applied to the electrode 6 by a second radio frequency power supply 12. This application of the radio frequency bias voltage enables reduction or elimination of adhesion of a reaction product to the susceptor 7, and/or removal of a reaction product from the susceptor 7.

Figure 2:
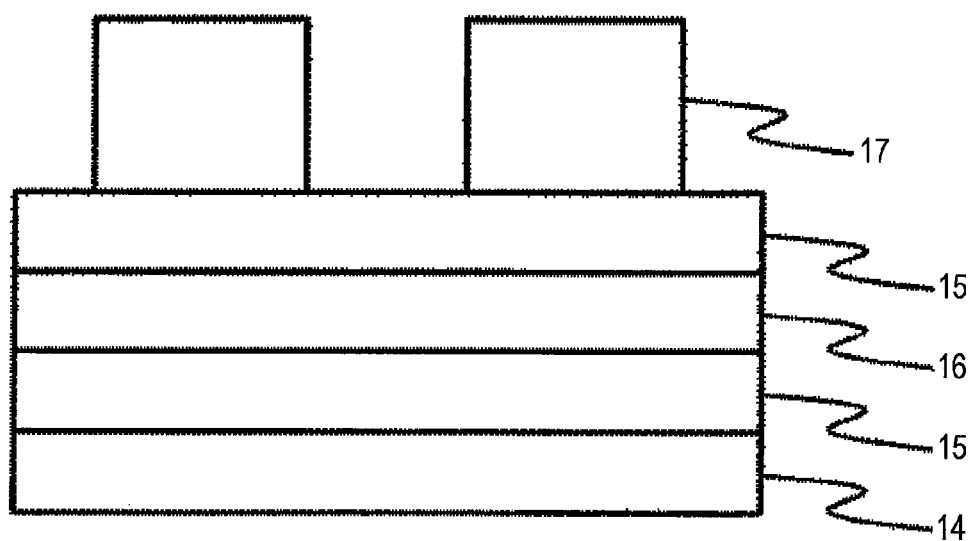
FIG. 2 is a diagram illustrating a film structure of a wafer 13 for use in one embodiment of the present invention.

FIG. 2 illustrates a film structure of the wafer 13 for use in one embodiment of the present invention. As shown in FIG. 2, a magnetic film 15 formed of cobalt iron (CoFe), a metal oxide film 16 formed of magnesium oxide (MgO), and another magnetic film 15 formed of cobalt iron (CoFe) are formed in a stacked manner in order from top to bottom over a silicon substrate 14. This structure is a magnetic tunnel junction (MTJ) device structure. A tantalum (Ta) film 17 is patterned as a mask over the topmost magnetic film 15.

Although this embodiment employs cobalt iron (CoFe) and magnesium oxide (MgO) for the magnetic films and for the metal oxide film, respectively, the present invention is not limited thereto. The magnetic films may also be formed of iron (Fe), nickel iron (NiFe), nickel iron cobalt (NiFeCo), or the like. The metal oxide film may also be formed of alumina ($Al_2O_3$) or the like.

That is, the magnetic films each contain at least one of iron (Fe), cobalt (Co), and nickel (Ni) elements; and the metal oxide film is at least an oxidized metal film. Further, in this embodiment, tantalum (Ta) is used for the mask. However, the mask material is not limited to tantalum (Ta) in the present invention, but a hard mask without tantalum (Ta), a resist mask, or a mask having a resist mask and a hard mask stacked on top of another may also be used.

Figure 3:
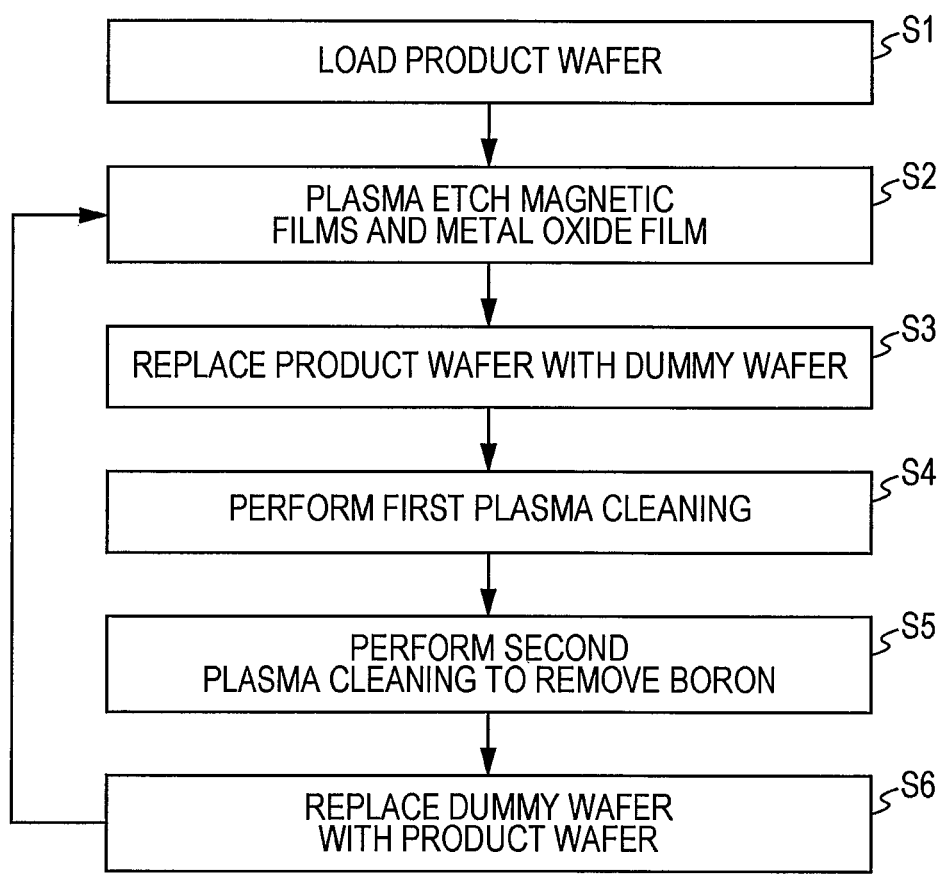
FIG. 3 is a flowchart of plasma processing according to one embodiment of the present invention.

A plasma processing method according to one embodiment of the present invention will now be described with reference to the plasma processing flow shown in FIG. 3. First, a wafer 13, such as one shown in FIG. 2, is mounted on the electrode 6 in the etching chamber by means of a carrier (not shown) (step S1). Next, using the tantalum (Ta) film 17 as a mask, the magnetic films 15 and the metal oxide film 16 of the wafer 13 are plasma etched under the plasma etching conditions as shown in Table 1 as follows: gas flow rate of $Cl_2$ gas of 20 ml/min.; gas flow rate of Ar gas of 80 ml/min.; process pressure of 0.3 Pa; plasma generation radio frequency power of 1000 W; radio frequency bias power to be supplied to the electrode 6 of 500 W; and radio frequency voltage applied to the Faraday shield 10 (hereinafter referred to as FSV) of 300 V (step S2).

In this embodiment, the gas for etching the magnetic films 15 and the metal oxide film 16 is a gas mixture of $Cl_2$ gas and Ar gas. However, $N_2$ gas, He gas, $H_2$ gas, $NH_3$ gas, CO gas, or $CH_3OH$ gas may be used. That is, any gas capable of etching the magnetic films 15 and the metal oxide film 16 can be used.

Examples of the etching process of the magnetic films 15 and the metal oxide film 16 include complete etching of both the magnetic films 15 and the metal oxide film 16, and etching the upper magnetic film 15 and then stopping etching at the metal oxide film 16. Also in the latter step in which etching is stopped at the metal oxide film 16, the metal oxide film 16 is slightly etched out, and thus oxide deposits are formed in the etching chamber similarly to the case of etching of this embodiment.

TABLE 1

| $Cl_2$ Gas (ml/min) | Ar Gas (ml/min) | Process Pressure (Pa) | Plasma Generation Radio Frequency Power (W) | Radio Frequency Bias Power (W) | FSV (V) |
|---|---|---|---|---|---|
| 20 | 80 | 0.3 | 1000 | 500 | 300 |

Figure 4:
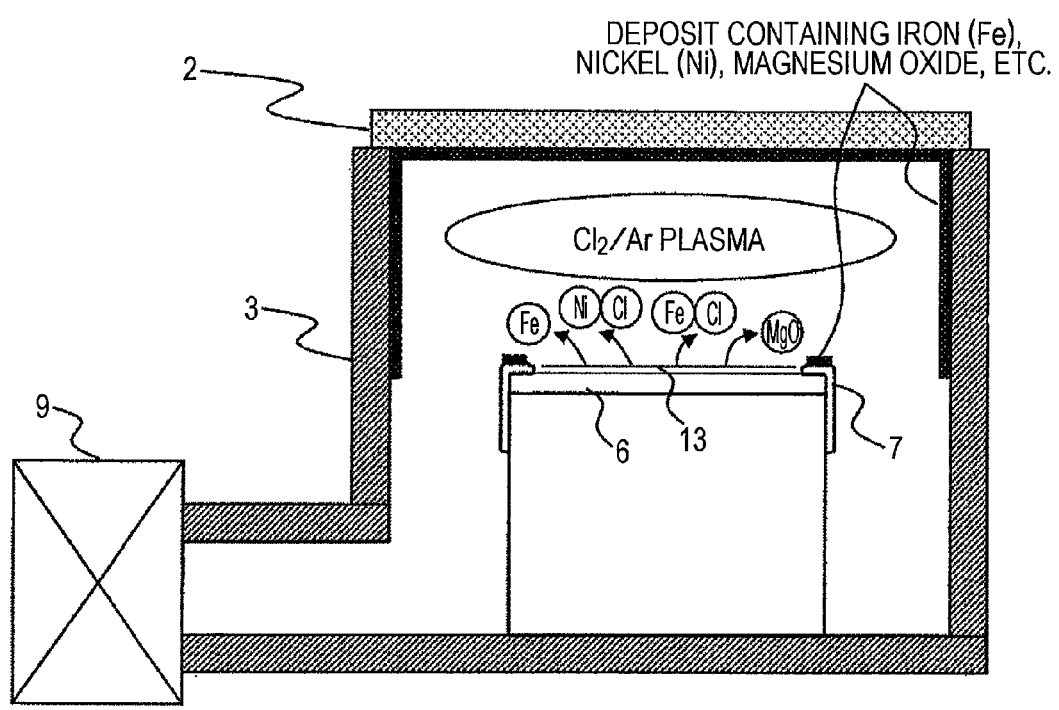
FIG. 4 is a diagram illustrating a condition in the etching chamber during a plasma etching step of a magnetic film.

Etching the magnetic films 15 and the metal oxide film 16 of the wafer 13 using the tantalum (Ta) film 17 as a mask under the conditions shown in Table 1 causes deposits containing one or more etched materials to be formed and adhere on an inner wall of the electric discharge unit 2 formed of ceramic ($Al_2O_3$), on the susceptor 7 that covers the surface, except for the wafer mount surface, of the electrode 6, and on the surroundings thereof, as shown in FIG. 4. A significant amount of such adhering deposits peel off of the inner wall of the etching chamber and/or of the susceptor 7 to form foreign matters.

Further, a significant amount of deposit adhering on the inner wall of the electric discharge unit 2 and/or on the susceptor 7 causes a change in the conditions of the plasma, causing a change over time in etching properties, such as an etching rate, uniformity, and/or an etching profile. Thus, such deposits need to be removed to achieve stable etching properties.

In the next step, the wafer 13 whose magnetic films 15 and metal oxide film 16 have been plasma etched is discharged from the etching chamber by means of a carrier (not shown), and instead, a dummy wafer is mounted on the electrode 6 in the etching chamber (step S3). Note that discharging from the etching chamber the wafer 13 whose magnetic films 15 and metal oxide film 16 have been plasma etched is essential in the present disclosure; however, loading a dummy wafer into the etching chamber is not necessarily required.

Next, as shown in Table 2, deposits from the magnetic films containing iron, cobalt, and/or tantalum deposited in the etching chamber are plasma cleaned under the first plasma cleaning conditions as follows: gas flow rate of $Cl_2$ gas of 120 ml/min.; gas flow rate of $BCl_3$ gas of 80 ml/min.; process pressure of 2.0 Pa; plasma generation radio frequency power of 2000 W; radio frequency bias power to be supplied to the electrode 6 of 650 W; and FSV of 1200 V (step S4).

TABLE 2

| $Cl_2$ Gas (ml/min) | $BCl_3$ Gas (ml/min) | Process Pressure (Pa) | Plasma Generation Radio Frequency Power (W) | Radio Frequency Bias Power (W) | FSV (V) |
|---|---|---|---|---|---|
| 120 | 80 | 2.0 | 2000 | 650 | 1200 |

A conceivable process in which the first plasma cleaning removes deposits formed from a magnetic film containing iron, cobalt, oxides, and/or tantalum deposited in the etching chamber may be explained as follows.

Plasma etching of the magnetic films 15 and the metal oxide film 16 causes iron (Fe) and nickel (Ni) contained in the magnetic films 15, which are etched materials, to chemically react with $Cl_2$ gas to generate chlorides (FeClx, NiClx) each having a high vapor pressure and being highly volatile. In addition, ions with high incident energy eject iron (Fe) and nickel (Ni) from the magnetic films, and magnesium oxide (MgO) from the insulation film.

Figure 5:
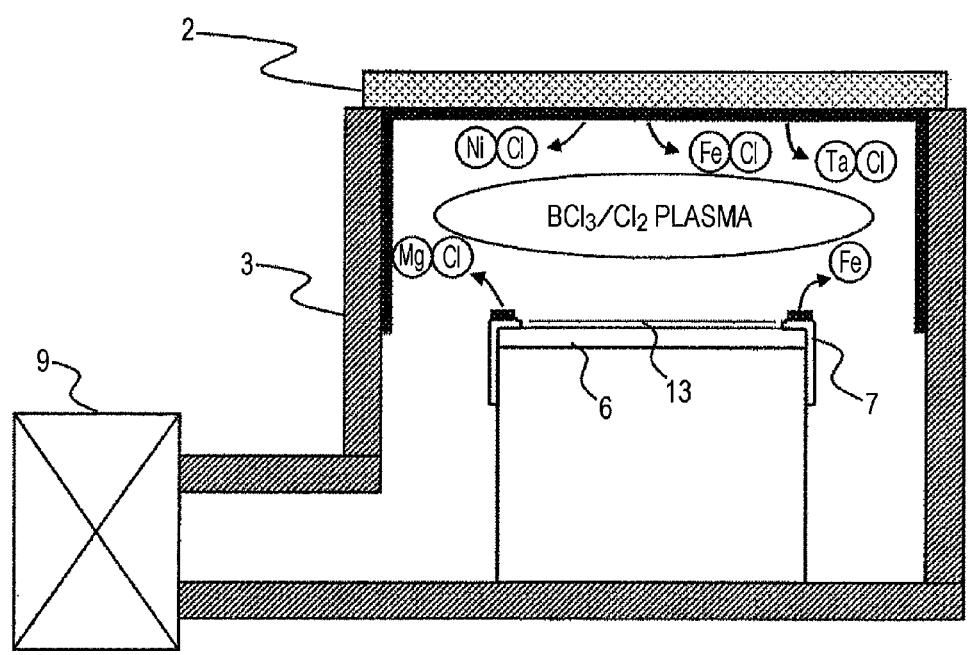
FIG. 5 is a diagram illustrating a condition in the etching chamber during a first plasma cleaning step.

Deposits from the oxide such as magnesium oxide (MgO) can be removed by forming a highly volatile product primarily by a reducing action of $BCl_3$ gas. Thus, plasma cleaning of the inside of the etching chamber using plasma formed from a gas mixture of chlorine gas and boron trichloride aimed at deposit removal causes deposits containing iron (Fe), nickel (Ni), and/or tantalum (Ta) adhering on an inner wall of the etching chamber and on the susceptor 7 to react with chlorine radicals in a similar manner to that during plasma etching. This reaction generates chlorides each having a high vapor pressure and being highly volatile as shown in FIG. 5. Thus, these deposits are removed.

Magnesium oxide (MgO) is removed in a similar manner such that magnesium oxide (MgO) reacts with boron (B), from $BCl_3$ gas, having high bond energy with oxygen constituent (0), resulting in cleavage of bond. This causes reaction between magnesium (Mg) and $Cl_2$ gas to generate chlorides, and magnesium oxide (MgO) is thus removed. Further, similarly to plasma etching of the magnetic films 15 and the metal oxide film 16, application of the radio frequency bias voltage permits ions having high energy to also enter the susceptor 7 to efficiently eject the deposits formed from the magnetic films 15 and the metal oxide film 16 deposited on the susceptor 7. Thus, the deposits are removed.

The deposits mentioned above are formed from the magnetic films 15 and the metal oxide film 16, which are etched materials. Therefore, the first plasma cleaning step can remove deposits in the etching chamber also by using plasma formed from gas used in the plasma etching step of magnetic films 15 and the metal oxide film 16. With these facts in mind, the first plasma cleaning step of this embodiment of the present invention has been determined to use plasma formed from a gas mixture of chlorine gas and boron trichloride.

If, after completion of the first plasma cleaning, the magnetic films 15 and/or the metal oxide film 16 of a next wafer 13 is subsequently plasma etched in the etching chamber after the first plasma cleaning, then a slight amount of boron remaining in the etching chamber and adhering on the inner wall of the etching chamber would remove, through a reducing action, the oxygen constituent of the metal oxide film 16, which is an etched material. This reduces electrical insulation effect of the insulation layer, and thus results in deterioration of device properties of the wafer 13.

Accordingly, in the present disclosure, the boron constituent remaining in the etching chamber due to the first plasma cleaning is removed after completion of the first plasma cleaning. More specifically, the inside of the etching chamber is plasma cleaned under the second plasma cleaning conditions for removing boron as shown in Table 3 as follows: gas flow rate of carbon tetrafluoride ($CF_4$) gas of 50 to 100 ml/min.; gas flow rate of oxygen ($O_2$) gas of 100 ml/min.; process pressure of 0.5 Pa; plasma generation radio frequency power of 1500 W; radio frequency bias power of 300 W; and FSV of 600 V (step S5).

TABLE 3

| $CF_4$ Gas (ml/min) | $O_2$ Gas (ml/min) | Process Pressure (Pa) | Plasma Generation Radio Frequency Power (W) | Radio Frequency Bias Power (W) | FSV (V) |
| --- | --- | --- | --- | --- | --- |
| 50 to 100 | 100 | 0.5 | 1500 | 300 | 600 |

Figure 6:
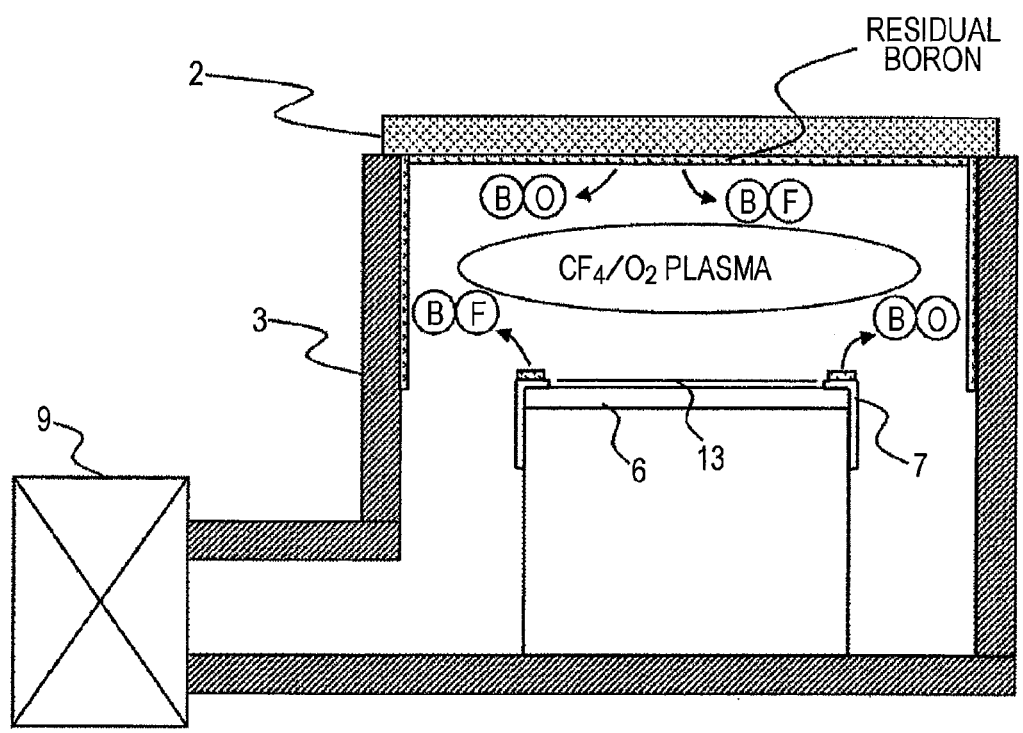
FIG. 6 is a diagram illustrating a condition in the etching chamber during a second plasma cleaning step.

Second plasma cleaning of the etching chamber that has undergone the first plasma cleaning causes the fluorine constituent and the oxygen constituent generated from the plasma formed from carbon tetrafluoride gas and oxygen gas to react with the boron constituent remaining in the etching chamber. This, then, forms boron trifluoride ($BF_3$) and boric oxide (BxOx) both having high bond energy as shown in FIG. 6, and therefore, the boron constituent remaining in the etching chamber that has undergone the first plasma cleaning can be efficiently removed.

The process described above to remove residual boron remaining in the etching chamber utilizes a reaction with the fluorine constituent. If only such reaction is to be taken into account, gas containing a high level of fluorine element, such as, for example, sulfur hexafluoride, may be more suitable for efficiently removing residual boron. However, an excessively high level of fluorine element generates an excess amount of radical, which may undergo a free-radical reaction with aluminum (Al), which is the base material in the etching chamber, and/or with anodized aluminum, which serves as a protective film of the inner wall of the etching chamber. This yields a significant amount of low-volatile aluminum fluoride (AlFx), which results in formation of foreign matters.

Carbon tetrafluoride having lower content of fluorine element than sulfur hexafluoride may also generate aluminum fluoride similarly. However, imposing a limitation on the gas flow rate used for carbon tetrafluoride can remove the residual boron constituent, and at the same time, reduce or eliminate excessive reaction with aluminum, which is the base material in the etching chamber. On the other hand, by imposing a limitation on the gas flow rate, the boron constituent in the etching chamber cannot be completely removed.

Thus, in order to compensate for shortfall in removal of residual boron, resulting from the use of only carbon tetrafluoride gas, boron oxide that is formed from oxygen gas and has high bond energy is generated. This enables the boron constituent remaining after the removal using carbon tetrafluoride gas can be removed from the etching chamber.

Further, if the mask contains a resist constituent, etching the magnetic films 15 and the metal oxide film 16 causes carbon-containing deposits to adhere to a surface of the etching chamber. Use of oxygen gas for cleaning generates highly-volatile compounds, such as carbon monoxide (CO) and carbon dioxide ($CO_2$), and thus enables carbon-containing deposits to be removed.

Boron oxide formed from oxygen gas plasma is generally low volatile, and may therefore cause foreign matters to be formed. However, in the time period between the first plasma cleaning step and the second plasma cleaning step, plasma formed from boron trichloride is first dissipated, and oxygen gas plasma is then generated after evacuation of the etching chamber. In addition, these plasmas are not formed from a gas mixture of oxygen and boron trichloride. Thus, foreign matters are very unlikely to be produced.

For these reasons, the method of this embodiment uses, as the gas for use in the second plasma cleaning, a gas mixture of carbon tetrafluoride gas and oxygen gas, which enables boron constituent to be efficiently removed, reduces or eliminates generation of an excess amount of fluorine radical, undergoes no excessive free-radical reaction with aluminum, which is the base material in the etching chamber, and does not produce foreign matters.

Further, the lower setting of FSV for the second plasma cleaning step than FSV for the first plasma cleaning step enables plasma to be formed not only on and near the inner wall of the electric discharge unit 2, but also in a broad area in the etching chamber. Therefore, residual boron constituent in the entire area within the etching chamber can be removed.

Next, after the second plasma cleaning step, the dummy wafer mounted on the electrode 6 is discharged from the etching chamber by means of the carrier (not shown), and a next wafer 13 is mounted on the electrode 6 in the etching chamber by means of the carrier (step S6). Then, the magnetic films 15 and the metal oxide film 16 of the wafer 13 mounted on the electrode 6 are plasma etched using the conditions shown in Table 1 (step S2). This plasma etching of the magnetic films 15 and the metal oxide film 16 of the wafer 13 mounted on the electrode 6 using the conditions shown in Table 1 causes the chlorine constituent, derived from $Cl_2$ gas included as shown in Table 1, to remain on the wafer 13 having the magnetic films 15, which are etched materials. If the wafer 13 is exposed to the air with such chlorine constituent remaining thereon, chlorine and moisture in the air react with each other to generate hydrochloric acid, creating a problem of corrosion of the wafer surface having the magnetic film 15.

In this regard, the present apparatus includes a chamber (not shown) capable of forming a SiN film, as a protective film, on the surfaces of the magnetic films 15 and of the metal oxide film 16 after plasma etching the magnetic films 15 and the metal oxide film 16. Therefore, plasma etching of the magnetic films 15 and the metal oxide film 16 using a gas mixture containing $Cl_2$ gas will not cause the residual chlorine constituent and moisture in the air to react with each other. Thus, the wafer surface will not corrode.

Then, the flow described above is repeated until all the magnetic films 15 and the metal oxide film 16 of a predetermined number of the wafers 13 are plasma etched.

According to this embodiment as described above, the present disclosure teaches that, after etching at least the magnetic film 15, a first cleaning step of removing deposits formed from the magnetic film by using $Cl_2$ gas and deposits formed from the oxide by using $BCl_3$ gas, and a second cleaning step of removing boron remaining after the first cleaning step by using a gas mixture of $CF_4$ gas and $O_2$ gas are performed, thereby to prevent deterioration of device properties of the wafer having a laminated structure including the magnetic films 15 and the metal oxide film 16 (i.e., reduction of the metal oxide film 16 by the residual boron), and at the same time, to efficiently remove deposits in the etching chamber in which the magnetic films 15 and the metal oxide film 16 have been plasma etched.

This embodiment has been described using an inductively-coupled plasma etching apparatus as an example of a plasma etching apparatus. However, the present invention is not limited thereto, but a microwave plasma etching apparatus, a capacitively-coupled plasma etching apparatus, a helicon wave plasma etching apparatus, and the like are also within the scope of the present invention.

This embodiment uses chlorine gas as the first plasma cleaning gas. However, a chlorine element-containing gas, such as HCl gas or $CCl_4$ gas, may also be used. This embodiment uses $O_2$ gas as the second plasma cleaning gas. However, oxygen element-containing gas, such as CO gas, or $CO_2$ gas, may also be used.

The invention claimed is:

1. A plasma processing method for transcribing a pattern of a mask onto a laminated film in which a first magnetic film, a metal oxide film arranged over the first magnetic film, and a second magnetic film arranged over the metal oxide film are deposited, the plasma processing method comprising:
   etching to plasma-etch the second magnetic film using the mask in a chamber; and
   cleaning to plasma-clean the chamber, in which the second magnetic film is plasma-etched, after the etching, wherein the cleaning includes:
   a first plasma cleaning to plasma-clean using a gas mixture of a chlorine gas and boron trichloride gas, and
   after the first plasma-cleaning and before another etching in the chamber, a second plasma-cleaning to plasma-clean using a gas mixture of carbon tetrafluoride gas and oxygen gas.

2. The plasma processing method according to claim 1, wherein the first and second magnetic films contain at least one of iron, cobalt, and nickel elements, respectively.

3. The plasma processing method according to claim 1, wherein the etching reaches the first magnetic film.

4. The plasma processing method according to claim 1, wherein the etching does not reach the first magnetic film.

5. The plasma processing method according to claim 1, wherein the metal oxide film is a magnesium oxide film.

6. The plasma processing method according to claim 1, wherein the mask includes a tantalum film, and
   wherein in the etching, the second magnetic film is etched using chlorine gas.

7. The plasma processing method according to claim 6, wherein the laminated film functions as a magnetic tunnel junction (MTJ) device having a structure in which the metal oxide film is interposed between the first and second magnetic films.

8. The plasma processing method according to claim 1, wherein, in the etching, the second magnetic film is etched using an inductively-coupled plasma etching apparatus having a Faraday shield, and
   wherein a radio frequency voltage applied to the Faraday shield during the second plasma-cleaning is lower than a radio frequency voltage applied to the Faraday shield during the first plasma-cleaning.

9. A plasma processing method for transcribing a pattern of a mask onto a laminated film in which a first magnetic film, a metal oxide film arranged over the first magnetic film, and a second magnetic film arranged over the metal oxide film are deposited, the plasma processing method comprising:
   etching to plasma-etch the second magnetic film using the mask in a chamber, the etching producing deposits containing one or more etched materials in the chamber; and
   cleaning to plasma-clean the chamber to remove the deposits, in which the second magnetic film is plasma-etched, after the etching,
   wherein the cleaning includes:
   first plasma cleaning to plasma-clean the chamber to remove the deposits using a gas mixture of a chlorine element-containing gas and boron trichloride gas, the first plasma cleaning producing residual boron in the chamber from the boron trichloride gas, and
   after the first plasma-cleaning and before another etching in the chamber, a second plasma-cleaning to remove the residual boron remaining in the chamber, and
   wherein the second plasma cleaning uses a gas mixture of carbon tetrafluoride gas and oxygen element-containing gas.

10. The plasma processing method according to claim 9, wherein the first and second magnetic films each contain at least one of iron, cobalt, or nickel elements.

11. The plasma processing method according to claim 9, wherein the etching reaches the first magnetic film.

12. The plasma processing method according to claim 9, wherein the etching does not reach the first magnetic film.

13. The plasma processing method according to claim 9, wherein the metal oxide film is a magnesium oxide film, and
    wherein the oxygen element-containing gas is oxygen gas.

14. The plasma processing method according to claim 13, wherein the chlorine element-containing gas is chlorine gas.

15. The plasma processing method according to claim 14, wherein the mask includes a tantalum film, and
    wherein in the etching, the second magnetic film is etched using chlorine gas.

16. The plasma processing method according to claim 15, wherein the laminated film functions as a magnetic tunnel junction (MTJ) device having a structure in which the metal oxide film is interposed between the first and second magnetic films.

17. A plasma processing method for transcribing a pattern of a mask onto a laminated film in which a first magnetic film, a metal oxide film arranged over the first magnetic film, and a second magnetic film arranged over the metal oxide film are deposited, the plasma processing method comprising:
    etching to plasma-etch the second magnetic film using the mask in a chamber, the etching producing deposits containing one or more etched materials in the chamber; and
    cleaning to plasma-clean the chamber to remove the deposits, in which the second magnetic film is plasma-etched, after the etching,
    wherein the cleaning includes:
    first plasma cleaning to plasma-clean the chamber to remove the deposits using a gas mixture of a chlorine element-containing gas and boron trichloride gas, the first plasma cleaning producing residual boron in the chamber from the boron trichloride gas, and after the first plasma-cleaning and before another etching in the chamber, a second plasma-cleaning to remove the residual boron remaining in the chamber, wherein the second plasma cleaning uses a gas mixture of carbon tetrafluoride gas and oxygen element-containing gas, wherein, in the etching, the second magnetic film is etched using an inductively-coupled plasma etching apparatus having a Faraday shield, and wherein a radio frequency voltage applied to the Faraday shield during the second plasma-cleaning using the gas mixture of carbon tetrafluoride gas and oxygen element-containing gas is lower than a radio frequency voltage applied to the Faraday shield during the first plasma-cleaning using the gas mixture of the chlorine element-containing gas and boron trichloride gas.

18. The plasma processing method according to claim 17, wherein the metal oxide film is a magnesium oxide film, and wherein the oxygen element-containing gas is oxygen gas.

19. The plasma processing method according to claim 18, wherein the chlorine element-containing gas is chlorine gas.

* * * * *